(12) United States Patent
Haratsch et al.

(10) Patent No.: US 7,647,548 B2
(45) Date of Patent: Jan. 12, 2010

(54) METHODS AND APPARATUS FOR LOW-DENSITY PARITY CHECK DECODING USING HARDWARE-SHARING AND SERIAL SUM-PRODUCT ARCHITECTURE

(75) Inventors: Erich F Haratsch, Bethlehem, PA (US); Ruwan Ratnayake, Cambridge, MA (US)

(73) Assignee: Agere Systems Inc., Allentown, PA (US)

( * ) Notice: Subject to any disclaimer, the term of this patent is extended or adjusted under 35 U.S.C. 154(b) by 704 days.

(21) Appl. No.: 11/496,121

(22) Filed: Jul. 31, 2006

(65) Prior Publication Data

US 2008/0052595 A1    Feb. 28, 2008

(51) Int. Cl.
G11C 29/00 (2006.01)
(52) U.S. Cl. ..................................... 714/800
(58) Field of Classification Search ................. 714/799, 714/800–801, 807
See application file for complete search history.

(56) References Cited

U.S. PATENT DOCUMENTS

| | | | |
|---|---|---|---|
| 6,539,367 B1 | 3/2003 | Blanksby et al. | 706/14 |
| 7,178,080 B2 | 2/2007 | Hocevar | 714/800 |
| 7,181,676 B2 | 2/2007 | Hocevar | 714/805 |
| 7,246,304 B2* | 7/2007 | Kim | 714/801 |
| 7,451,361 B2* | 11/2008 | Schmidt | 714/701 |
| 7,454,693 B2* | 11/2008 | Urard et al. | 714/800 |
| 2006/0107181 A1* | 5/2006 | Dave et al. | 714/758 |
| 2007/0033481 A1* | 2/2007 | Seki | 714/758 |

OTHER PUBLICATIONS

Cavus en al., A performance improvement and error floor avoidance technique for belief propagation decoding of LDPC codes, 2005, IEEE, p. 2386-2390.*
Blanksby et al., "A 690-mW 1-Gb/s 1024-b, Rate-1/2 Low-Density Parity-Check Code Decoder," IEEE Journal of Solid-State Circuits, vol. 37, No. 3, pp. 404-412 (Mar. 2002).
Hocevar et al., "A Reduced Complexity Decoder Architecture Via Layered Decoding of LDPC Codes," IEEE SIPS, p. 107-111 (2004).

(Continued)

*Primary Examiner*—Shelly A Chase
(74) *Attorney, Agent, or Firm*—Ryan, Mason & Lewis, LLP

(57) ABSTRACT

Methods and apparatus are provided for decoding codes that can be described using bipartite graphs having interconnected bit nodes and check nodes. A magnitude of a check-to-bit node message from check node j to bit node i is computed based on a sum of transformed magnitudes of bit-to-check node messages for a plurality of bit nodes connected to the check node j, less a transformed magnitude of the bit-to-check node message for bit node i and check node j. A sign of the check-to-bit node message from check node j to bit node i can also be computed by multiplying a product $S_j$ of the sign of bit-to-check node messages among a plurality of bit nodes connected to the check node j by the sign of the bit-to-check node message for bit node i and check node j. A decoder architecture is also disclosed for decoding a code that can be described using a bipartite graph having interconnected bit nodes and check nodes. The disclosed decoder can be concatenated with a soft output detector.

27 Claims, 5 Drawing Sheets

OTHER PUBLICATIONS

Hocevar et al., "LDPC Code Construction with Flexible Hardware Implementation," IEEE, pp. 2708-2712 (2003).

Mansour et al., "High-Throughput LDPC Decoders," IEEE Transactions on Very Large Scale Integration Systems, vol. 11, No. 6, pp. 976-996 (Dec. 2003).

Wu et al., "Equation Based LDPC Decoder for Intersymbol Interference Channels," IEEE ICASSP, pp. v-757-760 (2005).

Yeo et al., "VLSI Architectures for Iterative Decoders in Magnetic Recording Channels," IEEE Transactions on Magnetics, vol. 37, No. 2, pp. 748-755 (Mar. 2001).

\* cited by examiner

METHODS AND APPARATUS FOR LOW-DENSITY PARITY CHECK DECODING USING HARDWARE-SHARING AND SERIAL SUM-PRODUCT ARCHITECTURE

FIELD OF THE INVENTION

The present invention relates generally to coding and decoding techniques, and more particularly to decoder algorithms and architectures for use in decoding encoded signals.

BACKGROUND OF THE INVENTION

Coding is widely used to decrease bit and packet error probabilities in the transmission of digital information. In many applications, convolutional codes are used for this purpose. A convolutional code is defined by a state machine with state transitions determined by the input bits to be encoded. The two most common decoding algorithms for convolutional codes or codes based on convolutional codes are the Viterbi algorithm and the maximum a-posteriori probability (MAP) algorithm.

For applications requiring greater error correcting capability, turbo codes or LDPC codes are often used. The decoding of concatenated codes, such as turbo codes, requires the result of decoding one code trellis as input for decoding the next code trellis, and so on for subsequent code trellises. The iterative nature of the decoding algorithms for turbo codes present significant implementation challenges.

LDPC codes are promising next-generation error-correcting codes, which can outperform Turbo codes in terms of coding gain. A number of techniques have been proposed or suggested for parallel or serial decoding of LDPC codes. A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002) and U.S. Pat. No. 6,539,367, to Blanksby et al., for example, describe block-parallel decoding of Low Density Parity Check (LDPC) codes.

A serial implementation of an LDPC decoder may share some hardware and thus require a smaller number of computational elements and a less complicated routing mechanism compared to a parallel decoding method. The serial method, however, typically requires additional memory since all the messages along the edges of a bipartite graph need to be saved, and the throughput is limited since a serial implementation takes a larger number of clock cycles to decode a block of code. Generally, a bipartite graph is a graphical representation of a parity check matrix that is used by the LDPC code. The typical memory requirement is proportional to twice the number of edges in the code and the number of cycles is typically proportional to the sum of number of bit nodes and check nodes in the code.

Zining Wu and Gregory Burd, for example, have proposed a serial architecture for a communications system where an LDPC decoder is concatenated with a channel detector. The disclosed architecture reduces the memory requirement relative to a conventional serial implementation. See, Z. Wu and G. Burd, "Equation Based LDPC Decoder for Intersymbol Interference Channels," IEEE Proc. of Acoustics, Speech, and Signal Processing 2005 (ICASSP '05) Vol. 5, 757-60 (Mar. 18-23, 2005). D. E. Hocevar proposes a serial architecture for stand-alone LDPC decoders that also reduces the memory requirement relative to a conventional serial implementation. See, D. E. Hocevar, "LDPC Code Construction With Flexible Hardware Implementation," IEEE Int'l Conf. on Comm. (ICC), Anchorage, Ak., 2708-2712 (May, 2003).

A need still exists for a serial LDPC decoding architecture, both for stand-alone and concatenated LDPC decoders, that exhibits further improvements in the memory requirement or number of cycles per iteration (or both) and in bit error rate performance, relative to both parallel and serial implementations.

SUMMARY OF THE INVENTION

Generally, methods and apparatus are provided for decoding codes, such as LDPC codes, that can be described using bipartite graphs having interconnected bit nodes and check nodes. The bipartite graph can be, for example, a graphical representation of a parity check matrix. According to one aspect of the invention, a magnitude of a check-to-bit node message from check node j to bit node i is computed, wherein the magnitude is based on a sum of transformed magnitudes of bit-to-check node messages for a plurality of bit nodes connected to the check node j, less a transformed magnitude of the bit-to-check node message for bit node i and check node j. A sign of the check-to-bit node message from check node j to bit node i can also be computed by multiplying a product $S_j$ of the sign of bit-to-check node messages among a plurality of bit nodes connected to the check node j by the sign of the bit-to-check node message for bit node i and check node j.

In a concatenated embodiment of the invention, a magnitude of a check-to-bit node message from check node j to bit node i is computed, wherein the magnitude is based on a sum of transformed magnitudes of a-priori information values for a plurality of bit nodes connected to the check node j, less a transformed magnitude of the a-priori information value for bit node i. A sign of the check-to-bit node message from check node j to bit node i can also be computed by multiplying a product $S_j$ of the sign of a-priori information values for a plurality of bit nodes connected to the check node j by the sign of the a-priori information value for bit node i. The computations can be performed by an LDPC decoder concatenated with a soft output detector. The a-priori information values are generated by a soft output detector or computed based on soft outputs provided by a soft output detector.

According to a further aspect of the invention, a decoder architecture is disclosed for decoding a code that can be described using a bipartite graph having interconnected bit nodes and check nodes. The disclosed decoder can be implemented in a stand-alone mode or be concatenated with a soft output detector. The disclosed decoder comprises a bit node update unit and a plurality of parallel check node update units connected to the bit node update unit to compute a plurality of check-to-bit node messages.

In a stand-alone embodiment, the check node update units compute a magnitude of the check-to-bit node message based on a sum of transformed magnitudes of a plurality of bit-to-check node messages less a single transformed magnitude of a bit-to-check node message. In a concatenated embodiment, the check node update units compute a magnitude of the check-to-bit node message based on a sum of transformed magnitudes of a-priori information values for a plurality of bit nodes less a single transformed magnitude of an a-priori information value of a bit node.

A number of circuit units connected to memory are disclosed. The circuit units are comprised of a digital logic element, such as an adder, subtractor or XOR gate, and read circuitry or read/write circuitry. The disclosed circuit units perform various operations on transformed magnitudes and signs of a plurality of bit-to-check node messages in the stand-alone embodiment, and on transformed magnitudes and signs of a-priori information values in the concatenated embodiment.

A more complete understanding of the present invention, as well as further features and advantages of the present invention, will be obtained by reference to the following detailed description and drawings.

DETAILED DESCRIPTION

The present invention provides methods and apparatus for LDPC decoding using a hardware-sharing and serial sum-product architecture. The disclosed LDPC decoder performs the sum-product decoding algorithm with less memory and fewer clock cycles, relative to a conventional implementation.

Low-Density Parity Check Codes

The following background discussion of LDPC codes and LDPC decoding is based on a discussion in, A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002), incorporated by reference herein. For a more detailed discussion, the reader is referred to the full Blanksby and Howland paper.

Matrix Representation of LDPC Codes

LDPC codes are linear block codes. The set of all codewords, $x \in C_x$, spans the null space of a parity check matrix H:

$$Hx^T = 0, \forall x \in C_x. \quad (1)$$

The parity check matrix for LDPC codes is a sparse binary matrix.

Figure 1:
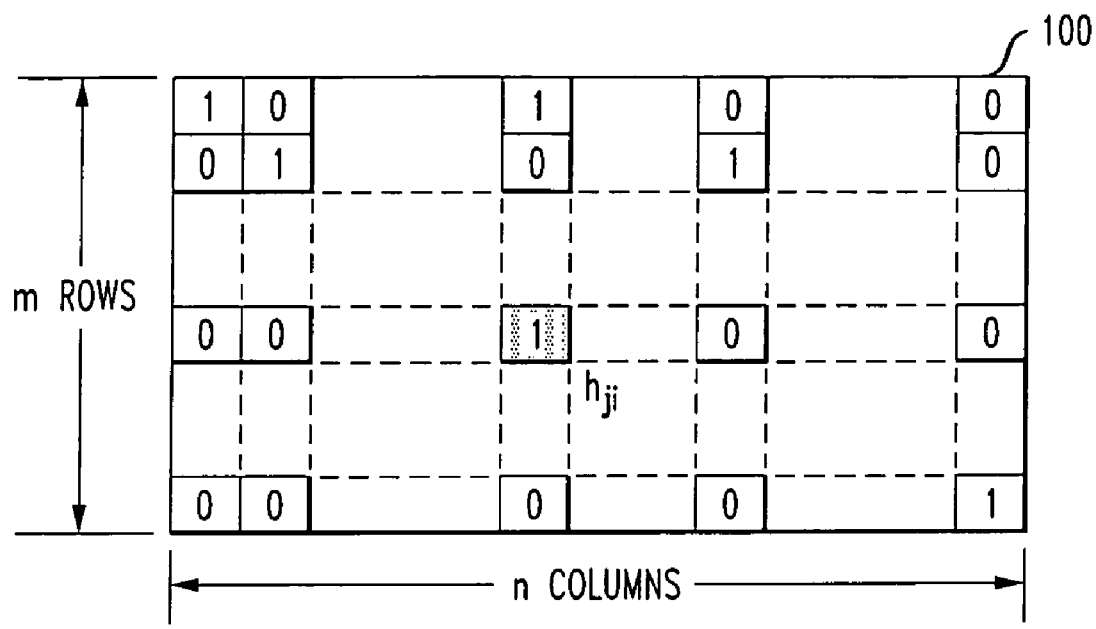
FIG. 1 illustrates the general structure of an LDPC matrix, H.

FIG. 1 illustrates the general structure 100 of an LDPC matrix, H. As shown in FIG. 1, each row of the parity check matrix, H, corresponds to a parity check and a set element $h_{ji}$ indicates that data bit i participates in parity check j. In a block of n bits, there are m redundant parity bits. The code rate is given by:

$$r = (n-m)/n \quad (2)$$

The set row and column elements of the parity check matrix H are selected to satisfy a desired row and column weight profile, where the row and column weights are defined as the number of set elements in a given row and column, respectively. In a regular LDPC code, all rows are of uniform weight, as are all columns. If the rows and columns are not of uniform weight, the LDPC code is said to be irregular.

Graph Representation of LDPC Codes

Figure 2:
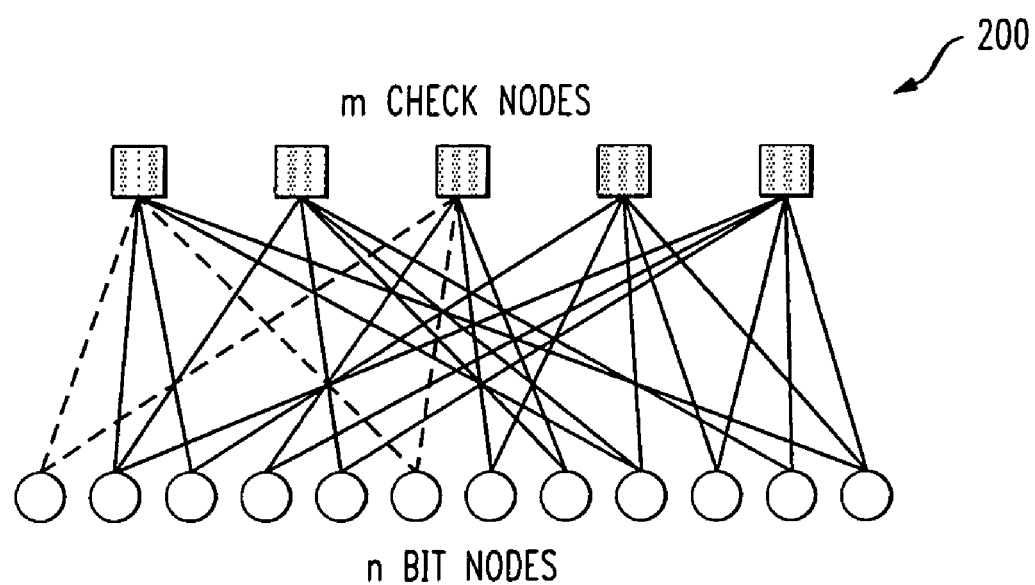
FIG. 2 is an exemplary bipartite graph representation of an LDPC code.

LDPC codes can also be represented using a bipartite graph, where one set of nodes represents the parity check constraints and the other set represents the data bits. FIG. 2 is an exemplary bipartite graph representation 200 of an LDPC code. The parity check matrix is the incidence matrix of the graph where a bit node i, corresponding to column i in H, is connected to check node j, corresponding to row j in H, if the entry $h_{ji}$ in His set, i.e., non-zero.

The algorithm used for decoding LDPC codes is known as the sum-product algorithm. For good decoding performance with this algorithm, it is important that the length of cycles in the graph representation of the LDPC code is as long as possible. In the exemplary representation of FIG. 2, an exemplary short cycle of length four has been illustrated. Short cycles, such as the length-4 cycle illustrated in FIG. 2, degrade the performance of the sum-product algorithm.

The Sum-Product Algorithm The sum-product algorithm is an iterative algorithm for decoding LDPC codes.

The sum-product algorithm is also known as the message passing algorithm or belief propagation. For a more detailed discussion of the sum-product algorithm, see, for example, A. J. Blanksby and C. J. Howland, "A 690-mW 1-Gb/s 1024-b, Rate-1/2 Low-Density Parity-Check Decoder," IEEE J. Solid-State Circuits, Vol. 37, 404-412 (March 2002), and D. E. Hocevar, "LDPC Code Construction With Flexible Hardware Implementation," IEEE Int'l Conf. on Comm. (ICC), Anchorage, Ak., 2708-2712 (May, 2003), each incorporated by reference herein.

The message from bit node i to check node j is given by:

$$Q_{i,j} = \sum_{l \in B_i, l \neq j} R_{l,i} + \lambda_i \quad (3)$$

It is noted that the notations used herein are defined in a table at the end of the specification. The message from check node j to bit node i is given by:

$$R_{j,i} = s_{j,i} \cdot \phi(\sum_{l \in C_j, l \neq i} \phi(|Q_{l,j}|)) \quad (4)$$

where:

$$s_{j,i} = \prod_{l \in C_j, l \neq i} \text{sign}(Q_{l,j}); \text{ and}$$

$$\phi(x) = -\log\tanh(x/2) = \log\frac{e^x + 1}{e^x - 1}.$$

The a-posteriori information value, which is also called a-posteriori log-likelihood ratio (LLR), for bit i, $\Lambda_i$, is given by:

$$\Lambda_i = \sum_{l \in B_i} R_{l,i} + \lambda_i.$$

LDPC Decoder

A significant challenge when implementing the sum-product algorithm for decoding LDPC codes is managing the passing of the messages. As the functionality of both the check and bit nodes is relatively simple, their respective realizations involve only a small number of gates. The main issue is the implementation of the bandwidth required for passing messages between the functional nodes.

Hardware-Sharing Decoder Architecture

Figure 3:
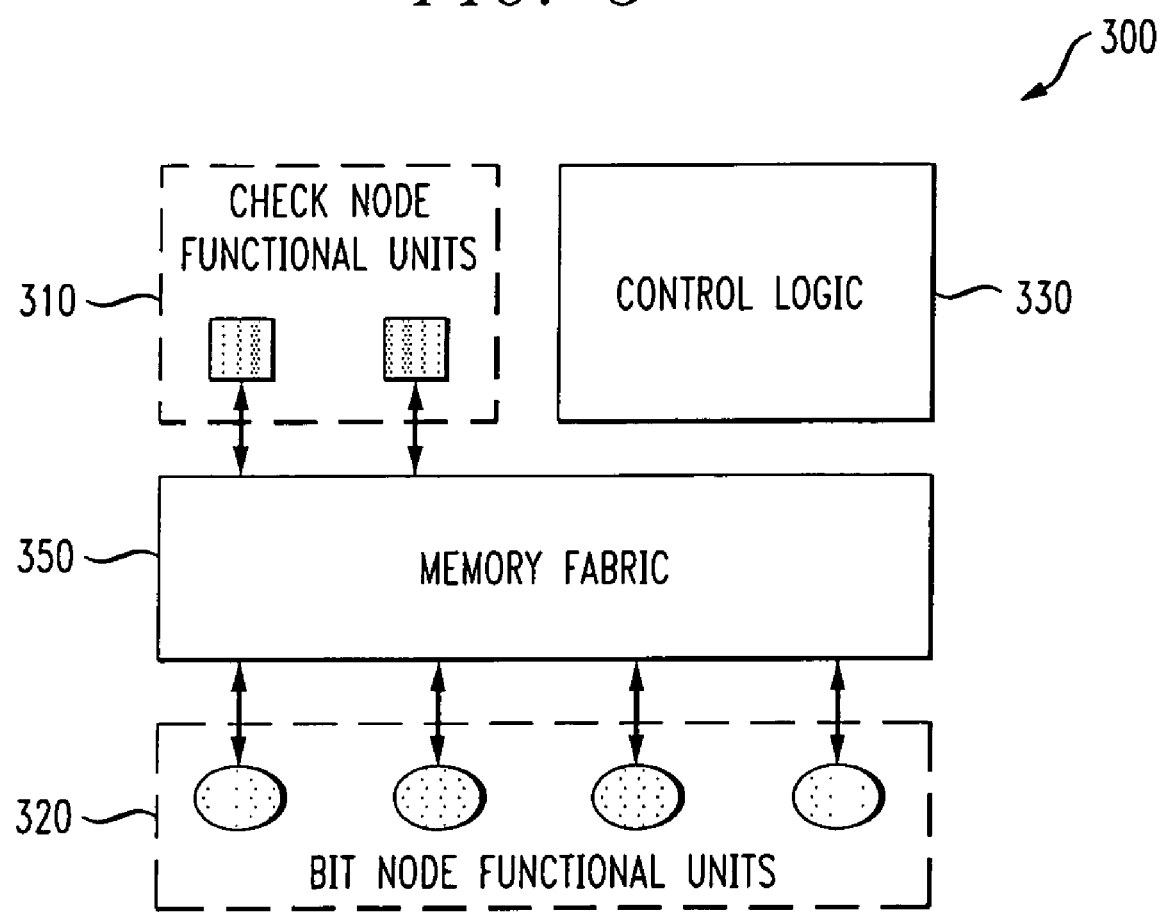
FIG. 3 is a block diagram of an exemplary hardware-sharing LDPC decoder architecture.

FIG. 3 is a block diagram of an exemplary hardware-sharing LDPC decoder architecture 300. As shown in FIG. 3, the generalized LDPC decoder architecture 300 comprises a number of functional units 310, 320 implementing either the check or bit node functionality, respectively, and a memory fabric 350 to store the messages and realize the graph connectivity. Control logic 330 controls the configuration of the memory fabric 350. For a detailed discussion of an implementation of a hardware-sharing LDPC decoder architecture 300, see, for example, E. Yeo et al., "VLSI Architectures for Iterative Decoders in Magnetic Recording Channels," IEEE Trans. On Magnetics, Vol. 37, No. 2, 748-755 (March 2001).

It has been recognized that such a hardware-sharing architecture reduces the area of the decoder.

Modified LDPC Parity Check Equations

The present invention recognizes that the components of the above LDPC parity check equations can be reorganized to yield improvements in the memory and clock cycle requirements. The check node computation shown in equation (4) can be separated into several components, as follows:

$$\rho_{i,j} = \phi(|Q_{i,j}|) \quad (5)$$

where $\rho_{i,j}$ is thus a transformed magnitude of the bit-to-check node message $Q_{ij}$ between bit node i and check node j and "| |" is the notation for magnitude.

$$\sigma_{i,j} = \text{sign}(Q_{i,j}) \quad (6)$$

Thus, $\sigma_{i,j}$ is the sign of the bit-to-check node message $Q_{i,j}$ between bit node i and check node j.

$$P_j = \sum_{l \in C_j} \rho_{l,j} \quad (7)$$

$P_j$ is computed for a check node j as the sum of the transformed magnitudes of the bit-to-check node messages for all the bit nodes connected to the check node j.

$$S_j = \prod_{l \in C_j} \sigma_{l,j} \quad (8)$$

$S_j$ for a given check node j is thus a product of the sign of the bit-to-check node messages for all the bit nodes connected to the check node j.

Then, the magnitude and sign of the message from check node j to bit node i is given by $$|R_{j,i}| = \phi(P_j - \rho_{i,j}) \quad (9)$$

$$\text{sign}(R_{j,i}) = S_j \cdot \sigma_{i,j} \quad (10)$$

Thus, while the conventional computation of the check-to-bit node messages according to equation (4) excludes the current bit node i from the computation ($l \in C_j$, $l \neq i$), the present invention computes an intermediate value $P_j$ as the sum of the transformed magnitudes $\rho_{l,j}$ of the bit-to-check node messages for all the bit nodes l connected to the check node j, and then subtracts $\rho_{ij}$ from $P_j$ to compute the magnitude of the message $R_{j,i}$ from check node j to bit node i.

In the exemplary embodiment, the bit node computations are performed in 2's-complements and the check node computations are performed in sign-magnitude (SM).

LDPC Decoder with Serial Sum-Product Architecture

Figure 4:
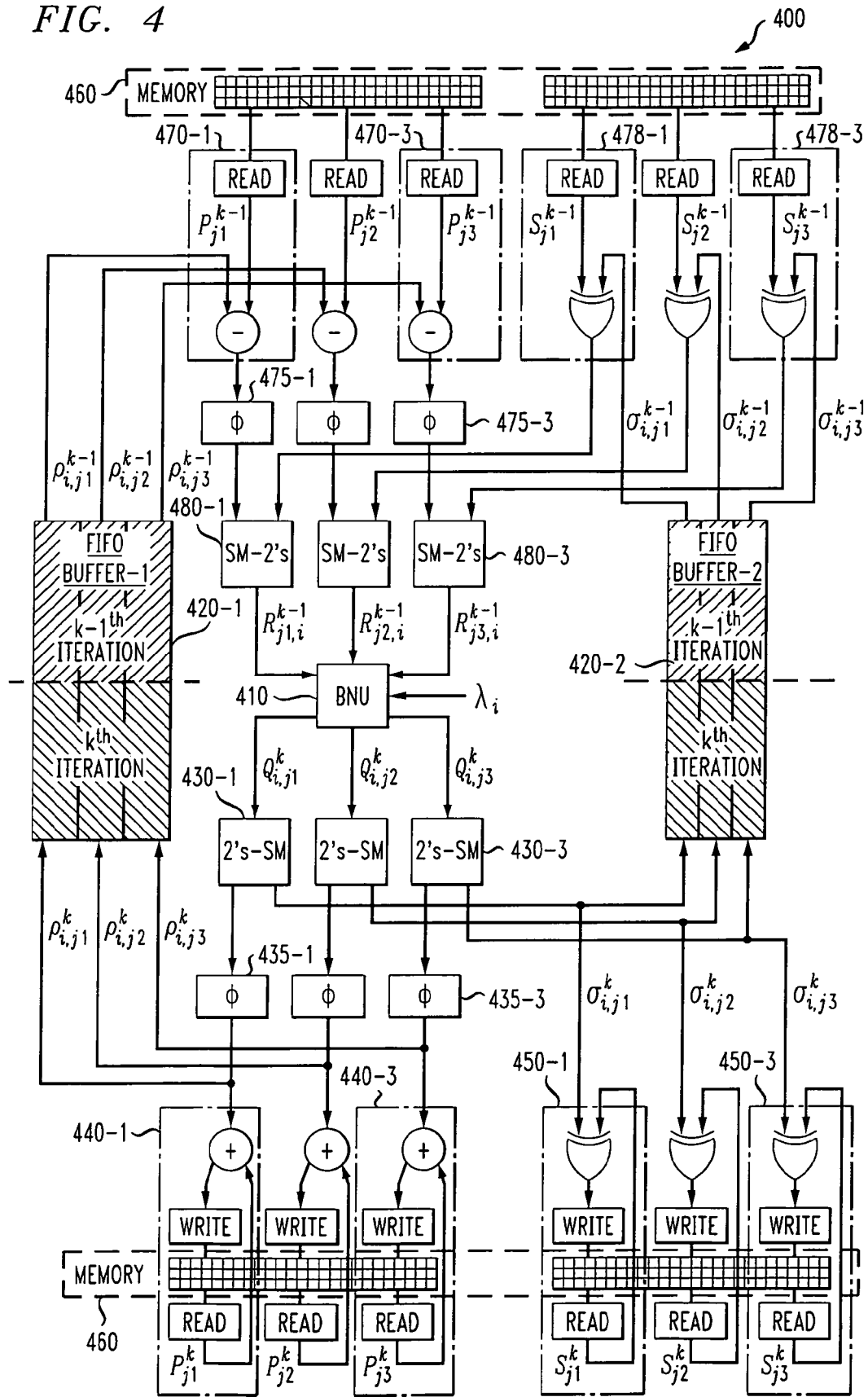
FIG. 4 is a block diagram of an LDPC decoder incorporating features of the present invention.

FIG. 4 is a block diagram of an LDPC decoder 400 incorporating features of the present invention. The exemplary embodiment of the LDPC decoder 400 shown in FIG. 4 illustrates an example where $d_c$ equals 3, and $B_i$ equals {j1, j2, j3}. The elements 430, 435, 440, 450, 470, 475, 478 and 480 form the check node update block, comprising parallel check node update units. At each time cycle, computations are performed pertaining to one bit node. Thus, it takes n cycles to perform complete computations for bit nodes 1 to n. Assume that bit node 1 is computed during the 1$^{st}$ time cycle. Then at the $(n \cdot (k-1)+i)^{th}$ time cycle, the bit node update unit 410 produces the $d_c$ messages $Q_{i,j}^k$, $j \in B_i$ corresponding to the $i^{th}$ bit node at the $k^{th}$ iteration These $d_c$ messages are converted from 2's-complement to sign-magnitude number representation at stage 430. The magnitude parts are sent to parallel transformation units 435-1 through 435-3 that perform the function $\phi$ and the outputs from these units 435 are $\rho_{i,j}^k$, $j \in B_i$ as defined by equation (5).

These $\rho_{i,j}^k$, $j \in B_i$ are fed to $d_c$ transformed magnitude update units 440 (to compute the sum $P_j^k$ over all bit nodes connected to the check node j, and then $P_j^k$ is taken out later in the next iteration) that consist of adders and read/write circuitry. The parallel transformed magnitude update units 440 can access any $d_c$ elements from m memory elements in the memory 460, where each element stores q bits, where q is the number of bits used to represent $P_j^k$ in the exemplary embodiment. These parallel transformed magnitude update units 440 update the relevant memory elements such that at the end of an iteration (i.e., $(n \cdot k)^{th}$ time cycle) there are $p_j^k$, $j \in 1 \ldots m$ as defined in equation (7), stored in the m memory elements. In other words, these memory elements keep a running sum of the relevant $\rho$ values.

If the intermediate values in the memory element j for the $k^{th}$ iteration is given by $P_j^k(i)$ for $i=1 \ldots n$, then the running sum at the $(n \cdot (k-1)+i)^{th}$ time instance is given by:

$$P_j^k(i) = \begin{cases} P_j^k(i-1) + \rho_{i,j}^k & \text{if } j \in B_i \\ P_j^k(i-1) & \text{else} \end{cases} \quad (11)$$

Then, at the end of an iteration, such as at $(n \cdot k)^{th}$ time instance:

$$P_j^k = P_j^k(n) \quad (12)$$

The signs of the bit-to-check node messages $Q_{i,j}^k$, $j \in B_i$, which are $\sigma_{i,j}^k$, $j \in B_i$ as defined by equation (6), are processed as follows. Similar to the procedure discussed above, $\sigma_{i,j}^k$, $j \in B_i$ are fed to another set of $d_c$ sign update units 450 that consist of XOR gates and read/write circuitry. These parallel sign update units update the relevant memory elements in the memory 460 such that at the end of an iteration, $S_j^k$, $j \in 1 \ldots m$ as defined in equation (8), are stored in m memory elements, where each memory element stores one bit. In other words, these memory elements keep a running product of the sign-bit $\sigma$ values. The product is obtained by the XOR gates. As explained in the previous paragraph, if the intermediate value of the memory element j for the $k^{th}$ iteration is given by $S_j^k(i)$ for $i=1 \ldots n$, then the running product is given by:

$$S_j^k(i) = \begin{cases} S_j^k(i-1) \cdot \sigma_{i,j}^k & \text{if } j \in B_i \\ S_j^k(i-1) & \text{else} \end{cases} \quad (13)$$

Then, at the end of an iteration, such as at $(n \cdot k)^{th}$ time instance:

$$S_j^k = S_j^k(n) \quad (14)$$

The $\rho_{i,j}^k, j \in B_i$ computed at each time cycle are also sent to a first in first out (FIFO) buffer 420-1 (buffer-1 in FIG. 4). The FIFO 420-1 consists of $d_c \cdot q$ columns (there are $d_c$ number of $\rho$ values generated at each cycle and each $\rho$ is represented using q bits in the exemplary embodiment) and n rows. At time cycle $n \cdot (k-1)+i$, the set of $\rho_{i,j}^k, j \in B_i$ is fed to the back of the FIFO 420-1 and a set of $\rho_{i,j}^{k-1}, j \in B_i$ from the previous iteration is read from the front of the buffer 420-1. At the $(n \cdot k)^{th}$ time cycle, all the $P_j^k$, $j=1 \ldots m$ are available in the memory 460 and all the $\rho_{i,j}^k$, $i=1 \ldots n, j \in B_i$ are available in the first FIFO buffer 420-1. Then, the top most row of the FIFO 420-1 holds $\rho_{1,j}^{k, j \in B}{}_1$ and the row after holds $\rho_{2,j}^k, j \in B_2$, and the last row of the buffer 420-1 consists of $\rho_{n,j}^k, j \in B_n$.

The $\sigma_{i,j}^k, j \in B_i$ computed at each time cycle are fed to another FIFO buffer 420-2 (buffer-2 in FIG. 4). The second FIFO buffer 420-2 consists of $d_c$ number of one bit columns (since each $\sigma_{i,j}$ is represented using one bit) and n rows. At time cycle $n \cdot (k-1)+i$, the set of $\sigma_{i,j}^k, j \in B_i$ is fed to the back of the FIFO 420-2 and a set of $\sigma_{i,j}^{k-1}, j \in B_i$ from the previous iteration is read from the front of the buffer 420-2.

Now, the procedure is explained for the computation of the magnitude of check-to-bit node messages $R_{j,i}^{k-1}$ from the $P_j^{k-1}, j=1 \ldots m$ saved in the memory 460 and the $\rho_{i,j}^{k-1}, j \in B_i$ saved in the first FIFO buffer 420-1 from the previous iteration k−1. The required $P_j^{k-1}, j \in B_i$ are read from memory 460 and the $\rho_{i,j}^{k-1}, j \in B_i$ are read from the first FIFO buffer 420-1. Then, the differences $(P_j^{k-1} - \rho_{i,j}^{k-1})$ are computed for each $j \in B_i$ by parallel transformed magnitude subtraction units 470-1 through 470-3 and the corresponding results are passed to parallel transformation units 475-1 through 475-3 that perform the function of $\phi$. The outputs of these transformations units 475 are the magnitudes of the corresponding messages from the $d_c$ check nodes to the $i^{th}$ bit node at the $(k-1)^{th}$ iteration, namely, $|R_{j,i}^{k-1}|, j \in B_i$ according to equation (9).

The sign of the check-to-bit node messages at the $(k-1)^{th}$ iteration (sign($R_{j,i}^{k-1}$)) is computed in a similar manner. The required $S_j^{k-1}, j \in B_i$ are read from memory 460 and the $\sigma_{i,j}^{k-1}$, $j \in B_i$ are read from the second FIFO buffer 420-2. Then, the products $S_j^{k-1} \cdot \sigma_{i,j}^{k-1}$ are computed using parallel sign processing units 478-1 through 478-3 (each using an XOR gate in the exemplary embodiment) for each $j \in B_i$. These products are the sign bits of the corresponding messages from the $d_c$ check nodes to the $i^{th}$ bit node at the $(k-1)^{th}$ iteration, namely sign $(R_{j,i}^{k-1}), j \in B_i$ according to equation (10).

The sign and magnitude of the check-to-bit node messages are passed through $d_c$ sign-magnitude to 2's-complement conversion units 480. The results from these units 480 are $R_{j,i}^{k-1}, j \in B_i$ which in turn are the inputs to the bit node update unit 410. The bit node update unit 410 computes the bit-to-check node messages $Q_{i,j}^k$ for the $k^{th}$ iteration according to (see also equation (3)):

$$Q_{i,j}^k = \sum_{l \in B_i, l \neq j} R_{l,i}^{k-1} + \lambda_i \quad (15)$$

Memory Requirements and Throughput

The exemplary first FIFO buffer 420-1 has a size of $n \cdot d_c \cdot q$ bits and the exemplary second FIFO buffer 420-2 has a size of $n \cdot d_c$ bits.

The amount of memory required for $P_j$, j equal to $1 \ldots m$ is $2 \cdot q \cdot m$ bits, where the multiple of two is for values pertaining to iterations k and k−1.

The amount of memory required for $S_j$, j equal to $1 \ldots m$ is $2 \cdot m$ bits, where the multiple of two is for values pertaining to iterations k and k−1.

The total memory requirement is $(2 \cdot m + n \cdot d_c) \cdot (q+1)$ bits.

At each time cycle, the disclosed method computes $d_c$ check-to-bit node messages and $d_c$ bit-to-check node messages. Thus, it takes n cycles to process length n blocks of data per iteration with one bit node update unit 410.

When compared with standard LDPC decoding architectures, the disclosed architecture only requires $(2 \cdot m + n \cdot d_c) \cdot (q+1)$ bits of memory space and takes only n cycles per iteration. It is noted that a typical serial sum-product architecture requires $2 \cdot n \cdot d_c \cdot (q+1)$ bits of memory space and m+n cycles per iteration.

Concatenated LDPC Decoder with Serial Sum-Product Architecture

Figure 5:
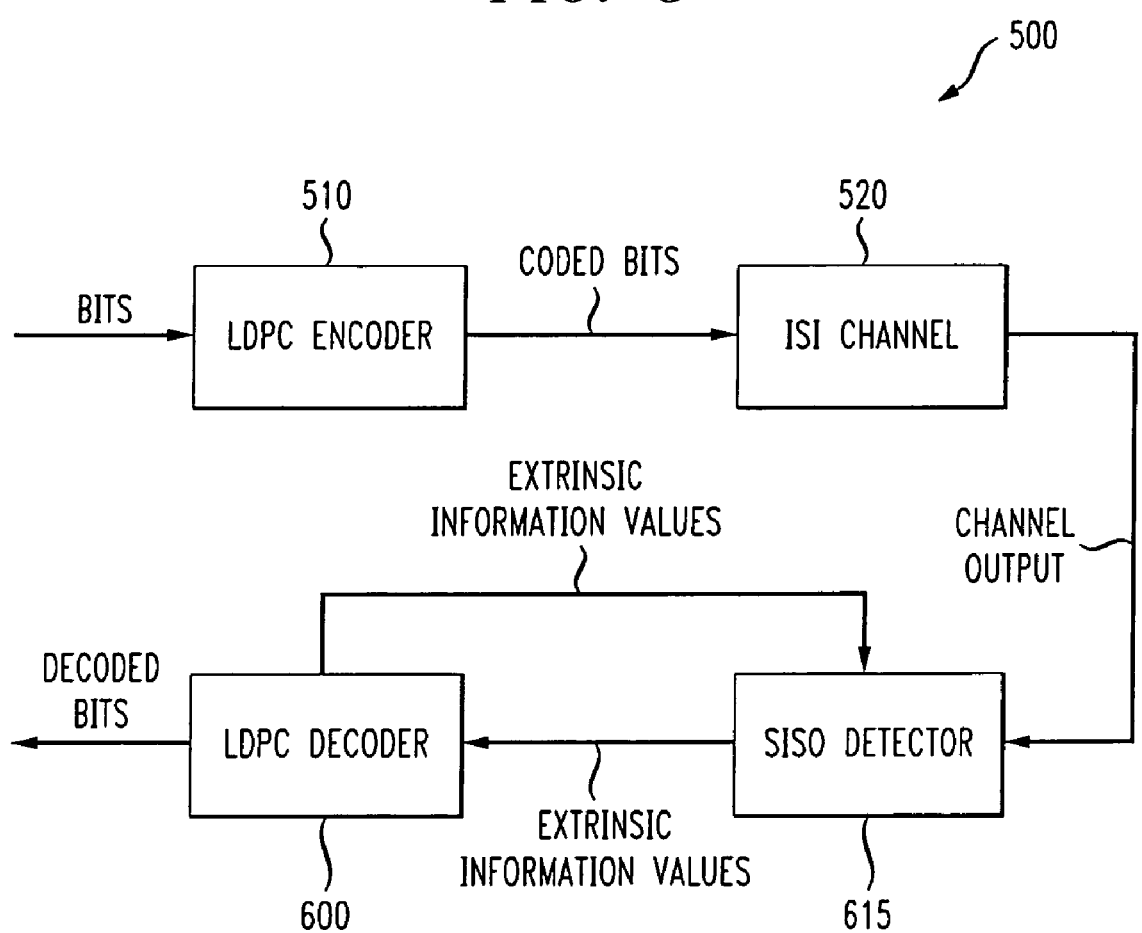
FIG. 5 is a block diagram of a typical communication system where an LDPC decoder is concatenated with a soft input soft output (SISO) detector.

LDPC codes can be used for channels impaired by intersymbol interference (ISI) and noise to improve the bit error rate. FIG. 5 shows a typical communication system 500 comprising an LDPC encoder 510, ISI channel 520 (that introduces intersymbol interference and noise), soft-input soft-output (SISO) detector 615 and LDPC decoder 600. In FIG. 5, the LDPC decoder 600 is concatenated with the SISO detector 615, as discussed further below in conjunction with FIG. 6. The SISO detector 615 takes in the channel output and the extrinsic information values from the LDPC decoder 600, which are used as a-priori information values. The SISO detector 615 gives out extrinsic information values, which are used as a-priori information values $\lambda_i$ by the LDPC decoder 600 for the next iteration. Extrinsic information values from the LDPC decoder are used as a-priori information values for the SISO detector and extrinsic information values from SISO detector are used as a-priori information values for the LDPC decoder. The SISO detector considers the ISI channel to compute the extrinsic information values for example using the MAP algorithm or the soft output Viterbi algorithm (SOVA) as known in the art, while the LDPC decoder considers the LDPC code to compute the extrinsic information values. An iteration of the system consists of processing the data by the SISO detector 615 and LDPC decoder 600 once.

Figure 6:
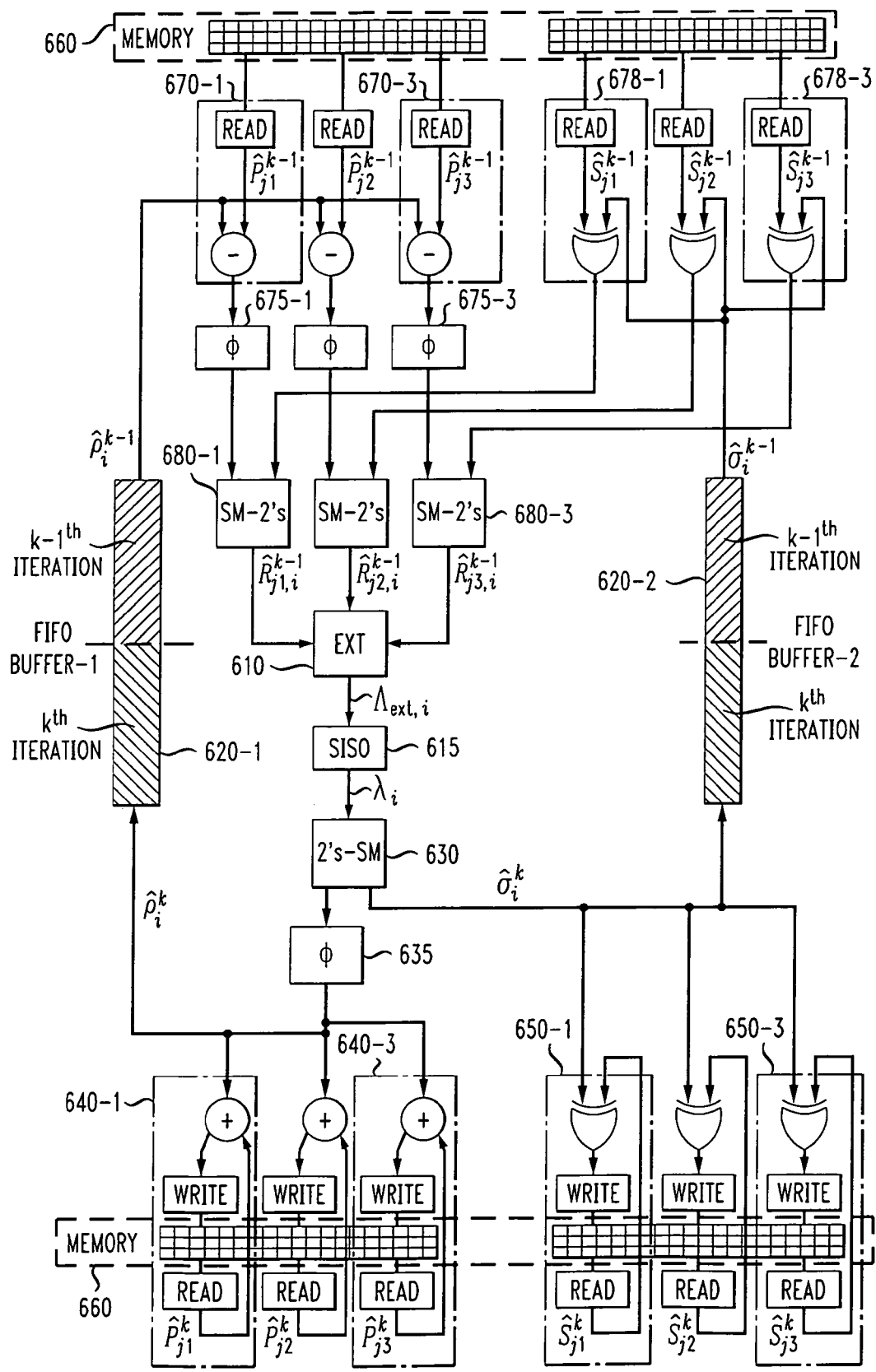
FIG. 6 is a block diagram of an LDPC decoder that is concatenated with a SISO detector.

FIG. 6 shows the disclosed concatenated SISO detector and LDPC decoder architecture in more detail. The SISO detector 615 takes in the channel output and the extrinsic information values from the LDPC decoder 600 and gives out extrinsic information values, which are used as a-priori information values $\lambda_i$ by the LDPC decoder 600 for the next iteration. The present invention exploits the fact that at every pass through the LDPC decoder 600, the $d_c$ messages from bit node i to its check nodes, namely, $\hat{Q}_{i,j}, \forall j \in B_i$ are equal to the a-priori information value or a-priori LLR $\lambda_i$ of the bit node i, i.e.:

$$\hat{Q}_{i,j} = \lambda_i, \forall j \in B_i. \quad (16)$$

The check node computation is broken into parts in a similar manner as described above.

$$\hat{\rho}_i = \phi(|\lambda_i|) \quad (17)$$

$$\hat{\sigma}_i = \text{sign}(\lambda_i) \quad (18)$$

$$\hat{P}_j = \sum_{l \in C_j} \hat{\rho}_l \quad (19)$$

$$\hat{S}_j = \prod_{l \in C_j} \hat{\sigma}_l \quad (20)$$

The sign and magnitude of the message from check node j to bit node i are given by:

$$|\hat{R}_{j,i}| = \phi(\hat{P}_j - \hat{\rho}_i) \quad (21)$$

$$\text{sign}(\hat{R}_{j,i}) = \hat{S}_j \cdot \hat{\sigma}_i \quad (22)$$

Using these $\hat{R}_{j,i}$, $j \in B_i$, the extrinsic information value from the LDPC decoder, which is passed to the SISO detector 615, can be computed by the extrinsic information computation unit 610:

$$\Lambda_{ext,i} = \sum_{l \in B_i} R_{l,i}. \quad (23)$$

This extrinsic information value is used by the SISO detector 615 as a-priori information value.

FIG. 6 shows a block diagram for the proposed architecture 600 for the concatenated system, where $d_c$ equals 3, and $B_i$ equals $\{j1, j2, j3\}$. Each a-priori LLR $\lambda_i$ pertaining to bit node i, which is equal to the extrinsic information value given out from the SISO detector 615, is passed to a 2's-complement to sign-magnitude conversion unit 630. The magnitude is sent to the transformation unit 635 that performs the function $\phi$ and the output from unit 635 is $\hat{\rho}_i^k$, as defined by equation (17). The transformed magnitude $\hat{\rho}_i^k$ for the $k^{th}$ iteration and $i^{th}$ bit node is fed to $d_c$ transformed magnitude update units 640 that update $\hat{P}_j^k$, $\forall j \in B_i$ in the memory. Similarly, the sign $\hat{\sigma}_i^k$ is passed into another set of $d_c$ sign update units 650 that update $\hat{S}_j^k$, $\forall j \in B_i$ in the memory. Moreover, $\hat{\rho}_i^k$ and $\hat{\sigma}_i^k$ are fed into a first FIFO buffer 620-1 and second buffer 620-2, respectively.

The check-to-bit node messages for the $(k-1)^{th}$ iteration, namely $\hat{R}_{j,i}^{k-1}$, $j \in B_i$ are computed in a similar manner as the procedure described above in conjunction with FIG. 4. Only one value, however, is used from the first FIFO buffer 620-1 ($\hat{\rho}_i^{k-1}$ is used to obtain the magnitude) and one value is used from the second FIFO buffer 620-2 ($\hat{\sigma}_i^{k-1}$ is used to obtain the sign). Thus, the memory requirements for the FIFO buffers 620 are $d_c$ times less than for the stand alone architecture described above in conjunction with FIG. 4.

Memory Requirements and Throughput

The exemplary first FIFO buffer 620-1 has a size of n q bits and the exemplary second FIFO buffer 620-2 has a size of n bits.

The amount of memory required for $P_j$, j equal to 1 . . . m is 2·q·m bits.

The amount of memory required for $S_j$, j equal to 1 . . . m is 2·m bits.

The total memory requirement is (2·m+n)(q+1).

At each time cycle, the disclosed method computes $d_c$ check-to-bit node messages and the extrinsic information value. Thus, it takes n cycles to process length n blocks of data per iteration.

The disclosed architecture performs the sum-product algorithm as defined by the equations (17) to (23). The disclosed method has better error rate performance than the less optimum method proposed by Wu and Burd, where only the minimum LLR values are considered in the sum-product algorithm. Moreover, the method proposed by Wu and Burd applies only to a concatenated LDPC decoder system. The present invention only requires (2·m+n)·(q+1) memory space and takes only n cycles per iteration.

Notation

The following notation has been used herein:
i is the index of a bit node;
j is the index of a check node;
k is the index of the iteration;
$Q_{i,j}$ is the message from bit node i to check node j;
$R_{j,i}$ is the message from check node j to bit node i;
$\lambda_i$ is the a-priori information value or a-priori log-likelihood ratio (LLR) pertaining to bit i;
$\Lambda_i$ is the a-posteriori information value or a-posteriori LLR pertaining to bit i;
$\Lambda_{ext,i}$ is the extrinsic information value or extrinsic LLR pertaining to bit i;
$B_i$ is the set of check nodes connected to bit node i;
$C_j$ is the set of bit nodes connected to check node j;
n is the number of bit nodes;
m is the number of parity check nodes;
$d_r$ is the row weight of the parity check matrix;
$d_c$ is the column weight of the parity check matrix;
bit nodes are 1 . . . n;
check nodes are 1 . . . m.

While exemplary embodiments of the present invention have been described with respect to digital logic units, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The memories and buffers could be distributed or local and the processors could be distributed or singular. The memories and buffers could be implemented as an electrical, magnetic or optical memory, or any combination of these or other types of storage devices. Moreover, the terms "memory," "buffer" and "FIFO buffer" should be construed broadly enough to encompass any information able to be read from or written to a medium. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for decoding a code that can be described using a bipartite graph having interconnected bit nodes and check nodes, comprising: computing on a processor a magnitude of a check-to-bit node message from check node j to bit node i, wherein said magnitude is based on a sum of transformed magnitudes of bit-to-check node messages for a plurality of bit nodes connected to said check node j, less a transformed magnitude of the bit-to-check node message for bit node i and check node j.

2. The method of claim 1, wherein said code comprises an LDPC code.

3. The method of claim 1, wherein said bipartite graph is a graphical representation of a parity check matrix.

4. The method of claim 1, further comprising the step of computing a sign of said check-to-bit node message from check node j to bit node i, by multiplying a product $S_j$ of the sign of bit-to-check node messages among a plurality of bit nodes connected to the check node j by the sign of the bit-to-check node message for bit node i and check node j.

5. A decoder for decoding a code that can be described using a bipartite graph having interconnected bit nodes and check nodes, comprising:
   a bit node update unit; and
   a plurality of parallel check node update units connected to said bit node update unit to compute a plurality of check-to-bit node messages.

6. The decoder of claim 5, wherein said plurality of parallel check node update units are connected to a memory.

7. The decoder of claim 5, wherein one of said check node update units computes a magnitude of said check-to-bit node message based on a sum of transformed magnitudes of a plurality of bit-to-check node messages less a single transformed magnitude of a bit-to-check node message.

8. The decoder of claim 5, wherein one of said check node update units comprises an adder and read/write circuitry connected to a memory to compute a sum of transformed magnitudes of a plurality of bit-to-check node messages.

9. The decoder of claim 5, wherein one of said check node update units comprises a subtractor and read circuitry connected to a memory to compute a difference between a sum of transformed magnitudes and a single transformed magnitude.

10. The decoder of claim 5, wherein a sum of transformed magnitudes of a plurality of bit-to-check node messages is obtained from a memory and a single transformed magnitude of a bit-to-check node message is obtained from a buffer.

11. The decoder of claim 5, wherein one of said check node update units computes a sign of a check-to-bit node message by multiplying a product $S_j$ of the sign among a plurality of bit-to-check node messages by the sign of a single bit-to-check node message.

12. The decoder of claim 5, wherein one of said check node update units comprises an XOR gate and read/write circuitry connected to a memory to compute a product $S_j$ of the sign among a plurality of the bit-to-check node messages.

13. The decoder of claim 5, wherein one of said check node update units comprises an XOR gate and read circuitry connected to a memory to multiply a product $S_j$ of the sign among a plurality of the bit-to-check node messages by the sign of a single bit-to-check node message.

14. A method for decoding a code that can be described using a bipartite graph having interconnected bit nodes and check nodes, comprising:
   computing a magnitude of a check-to-bit node message from check node j to bit node i wherein said magnitude is based on a sum of transformed magnitudes of a-priori information values for a plurality of bit nodes connected to said check node j, less a transformed magnitude of the a-priori information value for bit node i.

15. The method of claim 14, wherein said a-priori information values are generated by a soft output detector.

16. The method of claim 14, wherein said computing step is performed by an LDPC decoder that is concatenated with a soft output detector.

17. The method of claim 14, wherein said code comprises an LDPC code.

18. The method of claim 14, wherein said bipartite graph is a graphical representation of a parity check matrix.

19. The method of claim 14, further comprising the step of computing a sign of said check-to-bit node message from check node j to bit node i, by multiplying a product $S_j$ of the sign of a-priori information values for a plurality of bit nodes connected to the check node j by the sign of the a-priori information value for bit node i.

20. The decoder of claim 5, wherein one of said check node update units computes a magnitude of said check-to-bit node message based on a sum of transformed magnitudes of a-priori information values for a plurality of bit nodes less a single transformed magnitude of a a-priori information value of a bit node.

21. The decoder of claim 5, wherein one of said check node update units comprises an adder and read/write circuitry connected to a memory to compute a sum of the transformed magnitudes of a-priori information values.

22. The decoder of claim 5, wherein one of said check node update units comprises a subtractor and read circuitry connected to a memory to compute a difference between a sum of transformed magnitudes of a-priori information values and a single transformed magnitude of a a-priori information value.

23. The decoder of claim 5, wherein a sum of transformed magnitudes of a-priori information values is obtained from a memory and a single transformed magnitude of a a-priori information value is obtained from a buffer.

24. The decoder of claim 5, wherein one of said check node update units computes a sign of a check-to-bit node message by multiplying a product $S_j$ of the sign of a-priori information values among a plurality of bit nodes by the sign of a single a-priori information value of a bit node.

25. The decoder of claim 5, wherein one of said check node update units comprises an XOR gate and read/write circuitry connected to a memory to compute a product $S_j$ of the sign of a-priori information values among a plurality of bit nodes.

26. The decoder of claim 5, wherein one of said check node update units comprises an XOR gate and read circuitry connected to a memory to multiply a product $S_j$ of the sign of a-priori information values among a plurality of bit nodes by the sign of a single a-priori information value of a bit node.

27. The decoder of claim 5, wherein said decoder is concatenated with a soft output detector.

* * * * *